(12) United States Patent
Matsumoto et al.

(10) Patent No.: US 9,551,065 B2
(45) Date of Patent: Jan. 24, 2017

(54) AL-BASED ALLOY SPUTTERING TARGET AND CU-BASED ALLOY SPUTTERING TARGET

(75) Inventors: Katsushi Matsumoto, Kobe (JP); Junichi Nakai, Takasago (JP); Toshiaki Takagi, Takasago (JP)

(73) Assignees: Kobe Steel, Ltd., Kobe-shi (JP); KOBELCO RESEARCH INSTITUTE, INC., Kobe-shi (JP)

( * ) Notice: Subject to any disclaimer, the term of this patent is extended or adjusted under 35 U.S.C. 154(b) by 744 days.

(21) Appl. No.: 13/981,414

(22) PCT Filed: Dec. 20, 2011

(86) PCT No.: PCT/JP2011/079460
§ 371 (c)(1),
(2), (4) Date: Jul. 24, 2013

(87) PCT Pub. No.: WO2012/105136
PCT Pub. Date: Aug. 9, 2012

(65) Prior Publication Data
US 2013/0306468 A1 Nov. 21, 2013

(30) Foreign Application Priority Data
Feb. 4, 2011 (JP) .................................. 2011-023224

(51) Int. Cl.
*C23C 14/00* (2006.01)
*C23C 14/34* (2006.01)
(Continued)

(52) U.S. Cl.
CPC ............. *C23C 14/3407* (2013.01); *C22C 1/02* (2013.01); *C22C 9/00* (2013.01); *C22C 21/00* (2013.01); *C23C 14/3414* (2013.01)

(58) Field of Classification Search
CPC .................................................. C23C 14/3407
See application file for complete search history.

(56) References Cited

U.S. PATENT DOCUMENTS

| 6,264,813 B1 | 7/2001 | Leroy et al. | |
| 2005/0112019 A1* | 5/2005 | Nakai | C23C 14/14 420/550 |

(Continued)

FOREIGN PATENT DOCUMENTS

| CN | 101220458 A | 7/2008 |
| JP | 6-81141 | 3/1994 |

(Continued)

OTHER PUBLICATIONS

International Preliminary Report on Patentability and Written Opinion issued Aug. 6, 2013 in PCT/JP2011/079460 filed on Dec. 20, 2011(English translation ).

(Continued)

*Primary Examiner* — Keith Hendricks
*Assistant Examiner* — Timon Wanga
(74) *Attorney, Agent, or Firm* — Oblon, McClelland, Maier & Neustadt, L.L.P.

(57) ABSTRACT

Film-formation rate can be increased in the pre-sputtering and in the subsequent sputtering onto a substrate or the like, and sputtering failures such as splashes can be inhibited, by making an Al-based alloy or Cu-based alloy spurting target fulfill the following requirements (1) and/or (2) when the total area ratio of crystal orientations <001>±15°, <011>±15°, <111>±15°, <112>±15°, and <012>±15° in the sputtering surface normal direction in the depth within 1 mm from the uppermost surface of the sputtering target is referred to as a P value: (1) the area ratio PA of <011>±15° to the P value: 40% or lower; and (2) the total area ratio PB of <001>±15° and <111>±15° to the P value: 20% or higher.

8 Claims, 1 Drawing Sheet

(51) Int. Cl.
*C22C 9/00* (2006.01)
*C22C 21/00* (2006.01)
*C22C 1/02* (2006.01)

(56) References Cited

U.S. PATENT DOCUMENTS

| | | | |
|---|---|---|---|
| 2008/0223718 A1* | 9/2008 | Takagi | C22C 21/00 204/298.13 |
| 2009/0057139 A1* | 3/2009 | Fukushima | C23C 14/3407 204/298.13 |
| 2010/0000857 A1 | 1/2010 | Tonogi et al. | |
| 2012/0325655 A1 | 12/2012 | Iwasaki et al. | |

FOREIGN PATENT DOCUMENTS

| | | |
|---|---|---|
| JP | 6-128737 | 5/1994 |
| JP | 10-147860 | 6/1998 |
| JP | 10-199830 | 7/1998 |
| JP | 11-293454 | 10/1999 |
| JP | 2001-504898 | 4/2001 |
| JP | 2001-279433 | 10/2001 |
| JP | 2007-63621 | 3/2007 |
| JP | 2008-127623 | 6/2008 |
| JP | 2010-13678 | 1/2010 |
| JP | 2010-70857 | 4/2010 |
| TW | 200902738 | 1/2009 |
| WO | WO 2011/105583 A1 | 9/2011 |

OTHER PUBLICATIONS

International Search Report issued Mar. 13, 2012 in PCT/JP2011/079460.

* cited by examiner

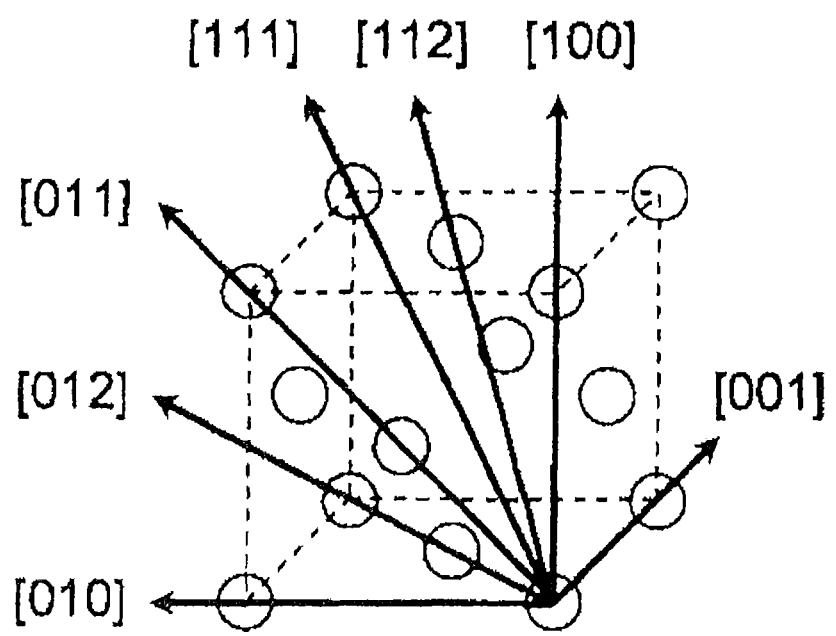

AL-BASED ALLOY SPUTTERING TARGET AND CU-BASED ALLOY SPUTTERING TARGET

CROSS-REFERENCE TO RELATED APPLICATIONS

This application is a National Stage of PCT/JP2011/079460, which was filed on Dec. 20, 2011. This application is based upon and claims the benefit of priority to Japanese Application No. 2011-023224, which was filed on Feb. 4, 2011.

TECHNICAL FIELD

The present invention relates to an Al-based alloy sputtering target and a Cu-based alloy sputtering target. More particularly, it relates to an Al-based alloy sputtering target and a Cu-based alloy sputtering target, both of which have controlled crystal orientations in the sputtering surface normal direction.

BACKGROUND ART

Al-based alloys and Cu-based alloys have widely been used, for the reasons of their having low electric resistivity and high processability, in the field of flat panel displays (FPDs) such as liquid crystal displays (LCDs), plasma display panels (PDPs), electroluminescence displays (ELDs), and filed emission displays (FEDs). More specifically, Al-based alloys and Cu-based alloys have been used for interconnection layers, electrode layers, reflective electrode layers, and other materials.

For example, active matrix-type liquid crystal displays each have thin-film transistors (TFTs) as switching elements, pixel electrodes formed from conductive oxide layers, and a TFT substrate having interconnection lines which include scan lines and signal lines. The scan lines and signal lines are electrically connected to the pixel electrodes. For interconnection materials forming scan lines and signal lines, there have widely been used pure Al thin films or various Al-based alloy thin films such as made of Al—Nd alloys, or pure Cu thin films or various Cu-based alloy thin films such as made of Cu—Mn alloys.

For the formation of Al-based alloy thin films or Cu-based alloy thin films, a sputtering method using a sputtering target has widely been used. In the sputtering method, a plasma discharge is first formed between a substrate and a sputtering target made of a material (target material) having the same composition as that of a thin film material. A gas ionized by the plasma discharge is then impinged on the target material to beat out the atoms of the target material and these atoms are deposited onto the substrate to form a thin film. Unlike a vacuum vapor deposition method or an arc ion plating method, the sputtering method has a merit that it can form a thin film having the same composition as that of a target material. In particular, Al-based alloy thin films or Cu-based alloy thin films, which are formed by the sputtering method, can provide a solid solution of alloy elements which are not made into a solid solution under the equilibrium state, and can exhibit excellent performance as thin films. Therefore, it is an industrially effective method of forming a thin film, and the development of a sputtering target as its material has been promoted.

In recent years, for making a response to an improvement in the productivity of FPDs and other requirements, film-formation rate in the sputtering step has a tendency to be made higher than the conventional one. Increasing sputtering power is the simplest way to make film-formation rate higher. However, if increasing sputtering power, sputtering failures such as splashes (fine melted particles) may occur to cause defects in interconnection thin films or the like, which leads to adverse effects such as a decrease in the yield and performance of FPDs.

Thus, for the purpose of preventing the occurrence of sputtering failures, for example, the methods described in patent documents 1 to 4 have been proposed. Among them, all of patent documents 1 to 3 have been made on the basis of the viewpoint that the occurrence of splashes is attributed to fine voids in the texture of a target material. The occurrence of splashes is prevented by controlling the dispersion state of particles of a compound between Al and a rare earth element in the Al matrix (patent document 1), controlling the dispersion state of a compound between Al and a transition element in the Al matrix (patent document 2), or controlling the dispersion state of an intermetallic compound between Al and an added element in the target (patent document 3). Patent document 4 discloses a technique to inhibit the occurrence of surface defects associated with machine processing and to reduce arcing which may occur in the sputtering, by adjusting the hardness of a sputter surface, followed by finish machine processing.

Furthermore, patent document 5 describes a method of carrying out sputtering at a high film-formation rate by controlling the ratio of crystal orientations on the sputter surface of a sputtering target. It is described therein that if the content ratio of crystal orientation <111> when the sputtering surface is observed by an X-ray diffraction method is increased to 20% or higher, the ratio of target substances flying in the direction normal to the sputtering surface is increased to make film-formation rate higher. In the section of Examples, the results are described, which were obtained by the use of an Al-based alloy target containing 1 mass % of Si and 0.5 mass % of Cu.

Also, patent document 6 has no explicit description of film-formation rate, but describes that to extend the electromigration lifetime of interconnection lines and improve the reliability of interconnection lines, the content ratio of crystal orientation <200> when the sputtering surface is observed by an X-ray diffraction method may be increased to 20% or higher. In the section of Examples, the results are described, which were obtained by the use of an Al-based alloy target containing 1 mass % of Si and 0.5 mass % of Cu.

On the other hand, the applicant of this application mainly discloses a technique to inhibit arcing which becomes a problem when film-formation rate is made higher (patent document 7). Patent document 7 is directed to an Al—Ni-rare earth element alloy sputtering target, and suggests that if the area ratio of specific crystal orientations is controlled, arcing can sufficiently be inhibited.

PRIOR ART DOCUMENTS

Patent Documents

Patent Document 1: Japanese Patent Laid-open Publication (Kokai) No. Hei 10-147860
Patent Document 2: Japanese Patent Laid-open Publication (Kokai) No. Hei 10-199830
Patent Document 3: Japanese Patent Laid-open Publication (Kokai) No. Hei 11-293454
Patent Document 4: Japanese Patent Laid-open Publication (Kokai) No. 2001-279433

Patent Document 5: Japanese Patent Laid-open Publication (Kokai) No. Hei 6-128737

Patent Document 6: Japanese Patent Laid-open Publication (Kokai) No. Hei 6-81141

Patent Document 7: Japanese Patent Laid-open Publication (Kokai) No. 2008-127623

SUMMARY OF THE INVENTION

Problems to be Solved by the Invention

As described above, sputtering failures such as splashes decrease the yield and productivity of FPDs, and cause a serious problem, particularly when film-formation rate in the sputtering is required to be made higher. Various techniques have hitherto been proposed for the improvement of sputtering failures and the improvement of film-formation rate, but further developments have been desired.

Al-based alloy and Cu-based alloy sputtering targets undergo the removal of impurities adhering to the target surface (presputtering) and other treatments to confirm that a thin film having a component composition at a desired ratio is formed, and then, the production of thin films is started. However, stabilization of film composition needs long-time presputtering, which greatly affects the production cost of thin films, and therefore, sputtering targets have been desired, which need further short presputtering time.

The present invention has been completed under the circumstances described above, and its object is to provide a technique capable of enhancing film-formation rate in the presputtering and in the subsequent sputtering onto a substrate or the like, when using an Al-based alloy sputtering target or a Cu-based alloy sputtering target, and capable of inhibiting sputtering failures such as splashes.

Means of Solving the Problems

The sputtering target of the present invention, which can solve the problems described above, comprises an Al-based alloy or a Cu-based alloy, wherein the Al-based alloy or Cu-based alloy sputtering target fulfills the following requirements (1) and/or (2), when crystal orientations <001>, <011>, <111>, <112>, and <012> in the sputtering surface normal direction in the depth within 1 mm from the uppermost surface of the sputtering target are observed by an electron backscatter diffraction pattern method and the total area ratio of <001>±15°, <011>±15°, <111>±15°, <112>±15°, and <012>±15° is referred to as a P value:

(1) the area ratio PA of <011>±15° to the P value: 40% or lower; and (2) the total area ratio PB of <001>±15° and <111>±15° to the P value: 20% or higher.

In a preferred embodiment, the Al-based alloy or Cu-based alloy sputtering target described above may fulfill the following requirements (3) and/or (4), when crystal orientations <001>, <011>, <111>, <112>, and <012> in the sputtering surface normal direction in the depth of a (¼)×t (thickness) portion from the surface of the sputtering target are observed by an electron backscatter diffraction pattern method and the total area ratio of <001>±15°, <011>±15°, <111>±15°, <112>±15°, and <012>±15° is referred to as a Q value:

(3) the ratio of the area ratio PA of <011>±15° in the depth within 1 mm from the uppermost surface to the area ratio QA of <011>±15° in the depth of the (¼)×t portion to the Q value: 0.8≥PA/QA; and (4) the ratio of the total area ratio PB of <001>±15° and <111>±15° in the depth within 1 mm from the uppermost surface to the total area ratio QB of <001>±15° and <111>±15° in the depth of the (¼)×t portion to the Q value: 1.2≤PB/QB.

In a preferred embodiment, the Al-based alloy described above may comprise 0.0001 to 1.0 mass % of Fe and 0.0001 to 1.0 mass % of Si.

In a further preferred embodiment, the Al-based alloy described above may further comprise 0.0001 to 0.5 mass % of at least one selected from the group consisting of Mn, Cr, Mo, Nb, Ti, and Ta.

In a preferred embodiment, the Cu-based alloy described above may comprise 0.00001 to 0.04 mass % of oxygen, 0.00001 to 0.003 mass % of hydrogen, and 0.01 mass % or lower of unavoidable impurities.

Effects of the Invention

The Al-based alloy sputtering target and Cu-based alloy sputtering target of the present invention provide high film-formation rate, particularly because of their having appropriately controlled crystal orientations in the sputtering surface normal direction near the sputtering target surface to be consumed in the presputtering. In addition, high film-formation rate can also be obtained in the sputtering by making the crystal orientations in the inner portion of the sputtering target different from those near the sputtering target surface. Therefore, the present invention makes it unnecessary to increase sputtering power in the presputtering as required in the prior art, thereby significantly improving productivity. The present invention further makes it possible both to improve film-formation rate in the sputtering onto a substrate or the like, subsequently to the presputtering, and to further inhibit the occurrence of sputtering failures (splashes).

BRIEF DESCRIPTION OF THE DRAWING

FIG. 1 is a view showing a face-centered cubic lattice together with typical crystal orientations.

MODE FOR CARRYING OUT THE INVENTION

The present inventors have made various studies to provide a technique capable of inhibiting the occurrence of sputtering failures (splashes), while making film-formation rate higher, particularly in the presputtering and in the sputtering, with respect to Al-based alloy sputtering targets to be used for the formulation of Al-based alloy thin films and Cu-based alloy sputtering targets to be used for the formation of Cu-based alloy thin films, both of which are useful as the materials of interconnection layers. As a result, they have found that the appropriate control of crystal orientations in the sputtering surface normal direction of Al-based alloy sputtering targets or Cu-based alloy sputtering targets can achieve the desired object, thereby completing the present invention.

The sputtering target "capable of inhibiting (reducing) the occurrence of splashes" as used herein means a sputtering target such that the number of splashes occurring when sputtering is carried out with sputtering power determined according to film-formation rate under the conditions described in Examples below (the average value at three positions, i.e., surface portion, (¼)×t portion, and (½)×t portion, of the sputtering target) is 21 pieces/cm$^2$ or less (preferably 11 pieces/cm$^2$ or less and more preferably 7 pieces/cm² or less). In the present invention, the tendency of splash occurrence is evaluated in the thickness (t) direction of a sputtering target. In this point, the present invention is different in evaluation criteria from the techniques of patent documents 2 to 7 described above, which fail to evaluate the occurrence of splashes in the thickness direction.

The term "Al-based alloy sputtering target" means a sputtering target mainly consisting of Al which contains pure Al and an alloy element or elements. Al—Fe—Si-based alloy sputtering targets containing Fe and Si as alloy components are particularly suitable for the present invention.

The term "Cu-based alloy sputtering target" means a sputtering target mainly consisting of pure Cu, examples of which may include oxygen-free copper (alloy designation, C1020), tough pitch copper (alloy designation, C1100), and phosphorous-deoxidized copper (alloy designation, C1201, C1220, and C1221), all defined in JIS H 3100. Cu-based alloy sputtering targets containing oxygen and hydrogen and further containing, as an unavoidable impurity or impurities described in JIS H 3100, a chemical component or components other than oxygen and hydrogen, are particularly suitable for the present invention.

First, referring to FIG. 1, an explanation will be given below on the crystal orientations characterizing the Al-based alloy sputtering target (and Cu-based alloy sputtering target) of the present invention. Al and Cu each have a crystal structure of face-centered cubic lattice (FCC: Face Centered Cubic lattice). Particularly Al-based alloy sputtering targets and Cu-based alloy sputtering targets in the component system as defined in the present invention exhibit the same behavior in the sputtering, and therefore, both will be explained together. Therefore, the term "Al-based alloy" can be replaced with the term "Cu-based alloy", unless otherwise referred to, in the present specification, and both may sometimes be expressed as the term "Al (Cu)-based alloy".

FIG. 1 is a view showing a typical crystal structure of face-centered cubic lattice and its crystal orientations. The indication method of crystal orientations used herein is an ordinary method. For example, [001], [010], and [100] are equivalent crystal orientations, and these three orientations are indicated together as <001>.

Al (Cu) has a crystal structure of face-centered cubic lattice as shown in FIG. 1, and has been known to mainly contain five crystal orientations, i.e., <011>, <001>, <111>, <012> and <112>, as crystal orientations in the sputtering surface normal direction [in the direction oriented to an opposing substrate (ND)] of a sputtering target. The orientation associated with the highest number density of atoms (close-packed orientation) is <011>, and the orientations associated with the next highest number density of atoms are <001>, <112>, <111> and <012>.

In general, the control of crystal orientations associated with high linear number density of atoms forming a sputtering target made of a polycrystalline texture so as to be directed as closely as possible to a substrate used for forming a thin film has been said to be good for making film-formation rate higher (e.g., patent document 5 described above). In the sputtering, atoms forming a sputtering target are pushed out of the sputtering target by collision with Ar ions. The mechanism has been said as follows: (a) each of the colliding Ar ion intrudes between the atoms of the sputtering target to vibrate surrounding atoms vigorously; (b) the vibration is propagated particularly in a direction associated with high number density of atoms in contact with each other and transmitted to the surface; and (c) as a result, atoms positioned on the surface in a direction having high number density of atoms are pushed out of the sputtering target. Therefore, it has been assumed that if the close-packed direction of each atom forming a sputtering target is oriented to an opposing substrate, efficient sputtering becomes possible to make film-formation rate higher.

Furthermore, in general, it has been said that the progression of erosion is different between crystals grains having different crystal orientations in the same sputtering surface of a sputtering target, and therefore, minute steps are formed between crystal grains. The steps have been said to be particularly easily formed when crystal orientation distribution has inhomogeneity in the sputtering surface.

However, atoms forming a sputtering target, which were released in the space from the sputtering surface, are not only deposited on an opposing substrate, but also attached onto the surrounding sputtering target surface, thereby forming a deposit. The attachment and deposition easily occur at the above steps between crystal grains, and the deposit becomes an origin of splashes to easily cause the occurrence of splashes. This seems to result in a significant decrease in the efficiency of sputtering step and in the yield of sputtering target.

Thus, studies have been made, even in the prior art, on a relationship between film-formation rate and crystal orientation; for example, in patent document 5 described above, when Si-containing Al-based sputtering targets are intended, it is regarded as better to increase the content ratio of crystal orientation <111> because film-formation rate is improved with an increase in the ratio of crystal orientation <111>. However, there also exist some techniques regarding the ratio of crystal orientation <111> as better when it is lower (e.g., patent documents 6 and 7), and the relationship between crystal orientation and film-formation rate remains largely unknown. Such seemingly-contradictory remarks seem to be due to various factors such as a difference in the evaluation method of crystal orientations, but there are no remarks specifically elucidating a relationship between sputtering target surface texture and film-formation rate.

Thus, as a result of the studies made by the present inventors, it has been found that when the texture of an Al (Cu)-based alloy sputtering target has an inhomogeneous distribution of crystal orientations in the sputtering surface and in the sputtering target thickness direction, film-formation rate inherent to the sputtering target is not uniform, and therefore, the occurrence of splashes is easily caused at a higher region of film-formation rate inherent to the sputtering target. It has also been found that film-formation rate is lowered, on the other hand, at a lower region of film-formation rate inherent to the sputtering target, and therefore, there is a possibility that productivity would significantly be lowered.

Furthermore, the present inventors have studied in detail the relationship between sputtering target surface texture after sputtering (after use) and crystal grain orientation by direct observation with a scanning electron microscope (SEM: Scanning Electron Microscope) or an electron backscatter diffraction pattern (EBSP: Electron Backscatter Diffraction Pattern) method. As a result, it has been found that Al (Cu)-based alloy sputtering targets have concave-convex surface and the crystal orientation in the sputtering surface normal direction of a convex portion is mainly formed by orientation <011>. It has also been found that a concave portion, on the other hand, is mainly formed by orientations <001> and <111>. In addition, the present inventors have found that orientation <011> forming a convex portion is hardly sputtered and orientations <001> and <111> forming a concave portion, on the other hand, are easily sputtered, thereby completing the present invention.

The crystal orientations of an Al (Cu)-based alloy as described herein were measured using an EBSP method, as shown below.

First, when the thickness of an Al (Cu)-based alloy sputtering target is expressed by t, the sputtering target is cut so that measuring surface (surface parallel to the sputtering surface) surely has an area of 10 mm or longer in length and 10 mm or longer in width with respect to the surface portion (within 1 mm from the uppermost surface) and the (¼)×t portion toward the thickness direction of the sputtering target, thereby making an EBSP measuring sample. The measuring surface is then made smooth by polishing with emery paper or by polishing with a colloidal silica suspension or the like. After that, the measuring surface is electrolytically polished with a mixed solution of perchloric acid and ethyl alcohol. Using the apparatus and software systems described below, the sputtering target described above was measured for crystal orientations.

Apparatus: electron backscatter diffraction pattern apparatus "Orientation Imaging Microscopy™ (OIM™)" available from EDAX/TSL Measuring software system: OIM Data Collection ver. 5

Analysis software system: OIM Analysis ver. 5

Measuring region: 1200 μm×1200 μm in area×50 nm in depth

Step size: 8 μm

Number of measured views: three views in the same measuring surface

Crystal orientation difference in analysis: ±15°

The wording "crystal orientation difference in analysis: ±15°" as used herein means that, for example, in the analysis of crystal orientation <001>, a certain crystal orientation, if it is within a range of <001>±15°, is regarded as being within the acceptable range and is determined as crystal orientation <001>. Crystal orientations, if they are with the acceptable range described above, can be regarded as one and the same orientation from the viewpoint of crystallography. As shown below, all the crystal orientations are calculated with the acceptable range off 15° in the present invention. A partition fraction in crystal orientation <uvw>±15° was determined as an area ratio.

The sputtering target of the present invention will hereinafter be explained for each requirement.

First, the requirements (1) and/or (2) of the present invention assume the observation, by an TBSP method, of crystal orientations <001>, <011>, <111>, <112> and <012> in the sputtering target surface normal direction in the depth within 1 mm from the uppermost surface of the sputtering target. The total area ratio of <001>±15°, <011>±15°, <111>±15°, <112>±15°, and <012>±15° is referred to as the P value. These five crystal orientations affect film-formation rate and exist in the sputtering target surface normal direction.

In the present invention, the measuring position was determined to be within 1 mm in the depth direction from the uppermost surface of the sputtering target (in the target thickness direction). This is because this region affects sputterability (ease in sputtering) in the presputtering. In other words, this is because the control of crystal orientations in the depth within 1 mm from the sputtering uppermost surface is effective to improve sputterability in this region. In the present invention, it is only necessary to fulfill at least one of the following requirements (1) and (2), thereby obtaining desired characteristics.

(1) The area ratio PA of <011>±15° to the P value: 40% or lower

In the initial stage of sputtering, the surface of a sputtering target is in a smooth state. For this reason, sputtering is easily affected by the plane orientation to the sputtering surface, and therefore, it is effective to lessen less sputtered crystal orientations. If crystal orientation <011>, which has a high number density of atoms and is less sputtered, is largely distributed in the sputtering surface normal direction in the region having a depth within 1 mm from the uppermost surface of a sputtering target, high film-formation rate cannot be obtained in the sputtering. Therefore, the area ratio PA of <011>±15° to the P value is set to 40% or lower, preferably 20% or lower (wherein the PA is an area ratio on the same plane surface as the measuring surface for the P value). The lower limit is not particularly limited, but may include 0%; however, the minimum ratio is about 1% from the viewpoint of controllability in the actual production.

(2) The total area ratio PB of <001>±15° and <111>±15° to the P value: 20% or higher As described above, in the initial stage of sputtering, the surface of a sputtering target is in a smooth state. For this reason, sputtering is easily affected by the plane orientation to the sputtering surface, and therefore, it is effective to lessen less sputtered crystal orientations. Therefore, the ratio of crystal orientations <111> and <001>, each of which has a high number density of atoms and is less sputtered, is regarded as better when it is higher. The total area ratio PB of <001>±15° and <111>±15° to the P value is set to 20% or higher, preferably 30% or higher (the PB is an area ratio on the same plane surface as the measuring surface for the P value). The upper limit is not particularly limited, but may include 100%; however, the maximum ratio is about 95% from the viewpoint of controllability in the actual production.

Furthermore, in a preferred embodiment, the sputtering target of the present invention may fulfill, in addition to the requirements (1) and/or (2) described above, the following requirements (3) and/or (4), when crystal orientations <001>, <011>, <111>, <112>, and <012> in the sputtering surface normal direction in the depth of a (¼)×t portion (wherein t represents the sputtering target thickness) from the surface of the sputtering target are observed by a EBSP method and the total area ratio of <001>±15°, <011>±15°, <111>±15°, <112>±15°, and <012>±15° is referred to as the Q value. The sputtering target of the present invention may fulfill at least one of the requirements (3) and (4).

(3) The ratio of the area ratio PA of <011>±15° in the depth within 1 mm from the uppermost surface to the area ratio QA of <011>±15° in the depth of the (¼)×t portion to the Q value: 0.8≥PA/QA.

(4) The ratio of the total area ratio PB of <001>±15° and <111>±15° in the depth within 1 mm from the uppermost surface to the total area ratio QB of <001>±15° and <111>±15° in the depth of the (¼)×t portion to the Q value: 1.2≤PB/QB.

If a sputtering target is consumed, with the progression of sputtering, to a depth beyond 1 mm from the uppermost surface before use, part of the sputtering surface may have inclinations or irregularities with relatively large curvature. This is because the sputtering target is not always uniformly consumed and the rate of target consumption becomes locally different. However, when the sputtering target surface comes to have irregularities, it results in that film-formation rate is affected by crystal orientations different from crystal orientations, such as described above, in the depth within 1 mm from the uppermost surface of the sputtering target. The surface texture of a sputtering target during sputtering differs for each sputtering. For this reason, specific crystal orientations do not always become superior for the improvement of film-formation rate, and therefore, crystal orientations in the inner portion (in the depth direction beyond 1 mm from the uppermost surface) of a sputtering target are desirable when they are as random as possible.

From such a viewpoint, the area ratio of <011>, which is lowered in the requirement (1) described above, is desirable to be made higher in the inner portion of a sputtering target in order to improve film-formation rate in the sputtering subsequent to the presputtering. Therefore, as defined in the requirement (3) described above, the ratio (PA/QA) of the area ratio PA of <011> in the depth within 1 mm from the uppermost surface of a sputtering target to the area ratio QA of <011> in the (¼)×t portion may preferably be 0.8 or lower, more preferably 0.7 or lower, and still more preferably 0.6 or lower. The lower limit is not particularly limited, but if the area ratio QA of <011> in the (¼)×t portion is too high, film-formation rate becomes low because crystal orientation <011> itself is less sputtered as described above, and therefore, the lower limit may preferably be 0.1 or higher, more preferably 0.2 or higher.

Similarly in the requirement (2) described above, the total area ratio PB of <111> and <001> in the depth within 1 mm from the uppermost surface of a sputtering target is made higher, and therefore, the total area ratio QB of <111> and <001> in the inner portion of the sputtering target is desirable to be lowered. For this reason, as defined in the requirement (4) described above, the ratio (PB/QB) of the total area ratio PB of <111> and <001> in the depth within 1 mm from the uppermost surface of a sputtering target to the total area ratio QB of <111> and <001> in the (¼)×t portion may preferably be 1.2 or higher, more preferably 1.5 or higher, and still more preferably 2.0 or higher. The upper limit is not particularly limited, but if the total area ratio QB of <111> and <001> in the inner portion is made too small, film-formation rate is lowered because crystal orientations less sputtered than <111> and <001> are largely distributed, and therefore, the upper limit may preferably be 10.0 or lower, more preferably 8.0 or lower.

In the present invention, the area ratio of crystal orientations other than described above is not particularly limited. For the improvement of film-formation rate and the reduction of sputtering failures, it is sufficient to define crystal orientations as described above, and there is almost no need to take into consideration the effect of other crystal orientations. This has been confirmed by experiments.

The above is an explanation of the crystal orientations characterizing the present invention.

The following will explain Al-based alloys to be intended in the present invention.

In the present invention, Al—Fe—Si-based alloys are suitable as the Al-based alloys. Al-based alloy sputtering targets containing Fe and Si are desirable because of their having low electric resistivity and being excellent in hillock resistance and dry etching characteristics, both of which are required in the formation of interconnection layers.

Fe content may preferably be 0.0001 mass % or higher to 1.0 mass % or lower. This is because if Fe content is lower than 0.0001 mass %, no effect, is provided on the properties (hillock resistance and dry etching characteristics) described above; and on the other hand, if Fe content is higher than 1.0 mass %, it becomes difficult to lower electric resistivity. Fe content may more preferably be 0.0005 mass % or higher to 0.5 mass % or lower, still more preferably 0.001 mass % or higher to 0.1 mass % or lower.

Si is an element desirable for further improving the Fe addition effect described above. In particular, low electric resistivity can be achieved by Al-based alloys containing Si added in combination with Fe. Si content may preferably be 0.0001 mass % or higher to 1.0 mass % or lower. If Si content is lower than 0.0001 mass %, the addition effect is low. On the other hand, if Si content is higher than 1.0 mass %, it becomes difficult to lower electric resistivity. Si content may more preferably be 0.001 mass % or higher to 0.5 mass % or lower.

In the present invention, Al-based alloys (preferably Al—Fe—Si-based alloys) further containing at least one selected from the group consisting of Mn, Cr, Mo, Nb, Ti and Ta are also intended. These elements are effective for improving the heat resistance of Al-based alloy layers to be formed using the Al-based alloy sputtering target of the present invention, and are also useful for the improvement of film-formation rate.

For such an effect to be exerted, at least one selected from the group consisting of Mn, Cr, Mo, Nb, Ti and Ta may preferably be contained at a content of 0.0001 mass % or higher (which is the amount of a single element when this single element is contained, or which is the amount of plural elements when these plural elements are contained; the same shall apply hereinafter). The content may more preferably be 0.001 mass % or higher, and still more preferably 0.01 mass % or higher. On the other hand, if the content is too high, it results in that Al-based alloy layers have high electric resistivity, and therefore, the content may preferably be 0.5 mass % or lower, more preferably 0.1 mass % or lower.

In the present invention, any of the usually used methods can be used as the method of adding the alloy elements described above. Typical examples may include adding them as a crystal grain refining agent into molten metal. The composition of a crystal grain refining agent is not particularly limited, so long as desired Al-based alloy sputtering targets can be obtained, but commercially available products can also be used.

The Al-based alloy components to be used in the present invention include alloy elements, the remainder of which may preferably be Al and unavoidable impurities. The Al-based alloy components to be used in the present invention may preferably include Fe and Si, the remainder of which may preferably be Al and unavoidable impurities. The Al-based alloy components to be used in the present invention may also preferably include at least one selected from the group consisting of Mn, Cr, Mo, Nb, Ti, and Ta, the remainder of which may preferably are Al and unavoidable impurities. The Al-based alloy components to be used in the present invention may more preferably include at least one selected from the group consisting of Mn, Cr, Mo, Nb, Ti, and Ta, in addition to Fe and Si, the remainder of which may preferably are Al and unavoidable impurities. Examples of the unavoidable impurities may include elements unavoidably incorporated in the production process or the like, such as C, O, and N, and their contents may preferably be each 0.001 mass % or lower.

The above is an explanation of Al-based alloys to be intended in the present invention.

The following will explain Cu-based alloys to be intended in the present invention.

In the present invention, pure Cu sputtering targets are suitable as Cu-based alloys (it means that the Cu-based alloys of the present invention include pure Cu). Pure Cu sputtering targets are desirable because of their having low electric resistivity and being excellent in hillock resistance and dry etching characteristics, both of which are required in the formation of interconnection layers. When a film is formed using a pure Cu sputtering target, Cu is oxidized to become copper oxide, in which case an increase in the oxygen content makes higher the electric resistivity of a Cu-based alloy layer and adversely affects the surface texture of the film. Therefore, the oxygen content may preferably be 0.04 mass % or lower. The lower limit is not particularly limited, but the oxygen content may preferably be 0.00001 mass % or higher from the viewpoint of actual detection limits. The oxygen content is measured using an inert gas fusion infrared absorption method.

The above is an explanation of Cu-based alloys to be intended in the present invention.

(Production Process of Sputtering Targets)

The following will explain a process for producing the Al (Cu)-based alloy sputtering target described above.

In the present invention, it is desirable to produce Al (Cu)-based alloy sputtering targets, based on a fusion casting method. Particularly in the present invention, for the purpose of producing an Al (Cu)-based alloy sputtering target having an appropriately controlled crystal orientation distribution, at least any of soaking conditions (e.g., soaking temperature, soaking time), hot rolling conditions (e.g., rolling start temperature, rolling finish temperature, maximum rolling reduction for each pass, total rolling reduction), and annealing conditions (e.g., annealing temperature, annealing time) are appropriately controlled in the steps of fusion casting, soaking if necessary, hot rolling, and then annealing; and furthermore, cold rolling and annealing are carried out, if necessary, subsequently to the steps described above.

The crystal orientation distributions, crystal grain size controlling means, and hardness adjusting means, which are applicable to the present invention, may vary with the types of Al (Cu)-based alloys. Therefore, appropriate means may be used by, for example, selecting one or a combination selected from the means described above, depending on the types of Al (Cu)-based alloys. A preferred process for producing the Al (Cu)-based alloy target described above of the present invention will be explained in detail step by step. The replacement of the term "Al-based alloy" with the term "Cu-based alloy" in the explanation given below makes it possible to produce Cu-based alloy targets in the same manner, and therefore, explaining portions other than particularly referred portions will be omitted to avoid overlap of explanations.

(Fusion Casting)

The fusion casting step is not particularly limited, but any of the steps usually used in the production of sputtering targets may appropriately be used to make an Al (Cu)-based alloy ingot. Typical examples of the casting method may include DC (semi-continuous) casting and thin-slab continuous casting (e.g., twin-roll method, belt-caster method, Properzi method, and block-caster method).

(Soaking, if Necessary)

After the Al (Cu)-based alloy ingot was made as described above, hot rolling is carried out, but soaking may be carried out, if necessary, before the hot rolling. To control the crystal orientation distribution, the soaking temperature may preferably be controlled to about 300° C. to 600° C., and the soaking time may preferably be controlled to about 1 to 8 hours.

(Hot Rolling)

After the soaking described above was carried out, if necessary, hot rolling is carried out. Particularly in the present invention, the relationship of both is controlled as defined in the requirements (1) to (4) described above by controlling the hot rolling conditions. More specifically, the crystal orientation distribution is controlled, not only in the in-plane direction in the depth within 1 mm from the uppermost surface of a sputtering target, but also in the inner portion (i.e., in the region beyond 1 mm in the depth direction from the uppermost surface, particularly in the (¼)×t portion) of the sputtering target. Particularly to achieve the controls as defined in the requirements (1) and (2) described above, the rolling conditions in the hot rolling (particularly, the maximum rolling reduction for each pass) may appropriately be controlled to introduce shear strain in the region having a depth within 1 to 3 mm from the uppermost surface, whereby plane orientations <111> and <001> can be introduced as the shear crystal texture to increase the area ratio PB of these plane orientations and decrease the area ratio PA of plane orientation <011> liable to develop as the rolling crystal texture.

Furthermore, to achieve the controls as defined in the requirements (3) and (4) described above, it is necessary to further control the crystal texture in the depth beyond 1 mm (preferably, in the (¼)×t portion; the same shall apply hereinafter) from the target surface. This particularly requires the appropriate control of the total reduction in the hot rolling step so that the area ratio QA of plane orientation <011> is relatively increased in the depth beyond 1 mm from the target surface with respect to the region near the target surface, in which region the area ratio PA of plane orientation <011> has positively been decreased. In addition, the total area ratio QB of plane orientations <001> and <111> is relatively decreased in the depth beyond 1 mm from the target surface with respect to the region near the target surface, in which region the total area ratio PB of plane orientations <001> and <111> has positively been increased. They make it possible to randomly control the crystal texture in the depth beyond 1 mm from the target surface so that film-formation rate can be improved when the sputtering target is consumed beyond 1 mm from the uppermost surface before use with the progression of sputtering.

The respective crystal textures as defined in the requirements (1) to (4) described above are not determined solely by the rolling conditions described above in the hot rolling, but also are affected by other various factors (e.g., annealing after hot rolling, annealing after cold rolling), and therefore, to make them into desired crystal textures, it is desirable to appropriately control the hot rolling conditions or the like.

In the present invention, it is desirable to appropriately control the hot rolling start temperature. If the hot rolling start temperature is too low, flow stress becomes higher, and therefore, rolling cannot be continued to a desired thickness in some cases. In the case of Al-based alloys, the hot rolling start temperature may preferably be 250° C. or higher, more preferably 300° C. or higher, and still more preferably 350° C. or higher. In the case of Cu-based alloys, the hot rolling start temperature may preferably be 300° C. or higher, more preferably 400° C. or higher, and still more preferably 500° C. or higher. On the other hand, if the hot rolling temperature is made too high, the distribution of crystal orientations in the sputtering surface normal direction, for example, may vary to cause an increase in the number of splash occurrence in some cases. In the case of Al-based alloys, the hot rolling start temperature may preferably be 600° C. or lower, more preferably 550° C. or lower, and still more preferably 500° C. or lower. In the case of Cu-based alloys, the hot rolling start temperature may preferably be 800° C. or lower, more preferably 750° C. or lower, and still more preferably 700° C. or lower.

When the maximum rolling reduction for each pass in the hot rolling is lower, a desired crystal texture can easily be obtained. However, this is not practical because the number of rolling pass in the hot rolling is excessively increased to result in significantly low productivity. The maximum rolling reduction for each pass may preferably be 5% or higher, more preferably 10% or higher, and still more preferably 15% or higher. On the other hand, if the maximum rolling reduction for each pass is too high, shear strain is hardly introduced into the region having a depth of 1 mm near the surface; therefore, the texture in the region having a depth within 1 mm from the uppermost surface is not made as intended, and the textures as defined in the requirements (1) and/or (2) described above cannot be obtained in some cases. The maximum rolling reduction for each pass may preferably be 35% or lower, more preferably 30% or lower, still more preferably 25% or lower, and further still more preferably 20% or lower.

If the total rolling reduction is too low, the crystal texture in the region (particularly, in the (¼)×t portion) beyond 1 mm from the surface cannot appropriately be controlled, and therefore, the texture as defined in the requirements (3) and/or (4) described above cannot be obtained in some cases. The total rolling reduction may preferably be 40% or higher, more preferably 50% or higher, and still more preferably 70% or higher. On the other hand, if the total rolling reduction is too high, flow stress becomes higher, and therefore, rolling cannot be continued to a desired thickness in some cases. The total rolling reduction may preferably be 95% or lower, more preferably 92% or lower, and still more preferably 90% or lower.

The rolling reduction for each pass and the total rolling reduction, as used herein, are respectively represented by the following expressions.

Rolling reduction for each pass (%)={(thickness before each pass of rolling)−(thickness after each pass of rolling)}/(thickness before each pass of rolling)×100

Total rolling reduction (%)={(thickness before start of rolling)−(thickness after finish of rolling)}/ (thickness before start of rolling)×100

(Annealing)

After hot rolling was carried out as described above, it is desirable to carry out annealing. To control the crystal orientation distribution and crystal grain size, the annealing temperature may preferably be 450° C. or lower. This is because crystal grains have a tendency to become coarse with a rise in the annealing temperature. On the other hand, the annealing temperature has no particular lower limit, and annealing is not necessarily carried out. If the annealing temperature is too low, desired crystal orientations cannot be obtained or coarse crystal grains remain unrefined when appropriate treatments have not been carried out by, for example, hot rolling, as described above. Therefore, when the annealing is carried out, the annealing temperature may preferably be 150° C. or higher, more preferably 180° C. or higher, and still more preferably 250° C. or higher. The annealing time may preferably be about 1 to 10 hours.

(Cold Rolling and then Annealing, if Necessary)

The production process described above makes it possible to control the crystal orientation distribution of a sputtering target, but may further comprises cold rolling and then annealing (the second rolling and the second annealing) subsequently. From the viewpoint of appropriately controlling the crystal orientation distribution and crystal grain size, it is preferable to control the annealing conditions. For example, it is recommended to control the annealing temperature in a range of 150° C. to 250° C. and the annealing time in a range of 1 to 5 hours.

In the cold rolling, if the rolling reduction is made too high, flow stress becomes too high, and therefore, rolling cannot be continued to a desired thickness. In the cold rolling, since the temperature is low, the material strength is high, and shear strain is hardly introduced into the surface layer portion due to the effect of lubricating oil to be used in the rolling; therefore, sputtering targets produced easily fall outside the ranges defined in the requirements (1) to (4). Therefore, the cold rolling reduction may preferably be 30% or lower, more preferably 25% or lower.

Furthermore, when these rolled plates are machine processed into sputtering targets, their rolled surface layer portions are usually cut to a depth of about 0.3 to 1.5 mm to form sputtering surfaces. The textures as defined in the requirements (1) to (4) described above are those observed after this machine processing, and the controlling conditions described above are set on the basis of this machine processing.

EXAMPLES

The present invention will hereinafter be explained more specifically with Examples. However, the present invention is not limited to the Examples described below, but the present invention can also be put into practice after appropriate modifications within a range capable of meeting the spirit of the present invention. All the modified embodiments will be included in the technical scope of the present invention.

Example 1

Various Al-based alloys having the compositions shown in Table 1 were prepared, and their ingots were made by a DC casting method. After that, the ingots were each hot-rolled and annealed under the conditions described in Table 1, thereby making rolled plates. The rolled plates were each cooled to room temperature and then cold-rolled in an appropriate manner at the respective rolling reductions described in Table 1, followed by annealing in an appropriate manner, thereby making rolled plates.

Subsequently, machine processing (round punching and lathe processing) was carried out to cut each rolled plate from the surface portion to the depth of 0.5 mm toward the thickness (t) direction of the rolled plate. Thus, Al-based alloy sputtering targets (size: 4 inches in diameter×8 mm in thickness) were produced, each thickness of which was controlled by lathe processing so that the surface after the cutting became a sputtering surface.

As a reference example, a pure Al (purity, 4N) sputtering target was produced. In this example, the hot rolling start temperature was set at 610° C., the maximum rolling reduction for each pass was set to 50%, and the cold rolling reduction was set to 50%.

(Crystal Orientations)

Using the sputtering targets described above, crystal orientations in the sputtering surface normal direction were measured, based on the EBSP method described above, and they were analyzed to determine P, PA, PB, Q, QA, and QB values. Then, (1) the area ratio PA of the surface portion [(PA/P)×100], (2) the area ratio PB of the surface portion [(PB/P)×100], (3) the ratio of the area ratio PA of the surface portion to the area ratio QA of the (¼)×t portion [PA/QA], and (4) the ratio of the area ratio PB of the surface portion to the area ratio QB of the (¼)×t portion [PB/QB], were calculated.

In addition, using each of the sputtering targets described above, film-formation rate and number of splash occurrence in the sputtering were measured.

(Measurement of Film-Formation Rate)

Using the sputtering targets described above, film-formation rate was measured in the sputtering, both to the depth of 1 mm in the surface portion and to the (¼)×t portion.

The sputtering was carried out under the conditions described below, and thin films were each formed on glass substrates to have a thickness of about 600 nm. The film-formation rate was calculated by the expression described below. For the actual thickness, thickness was measured at three points at 5 mm intervals in an arbitrary in-plane direction from the center of the thin film surface by a stylus profilometer, and its average value was regarded as the thickness.

Sputtering apparatus: HSR-542S available from Shimadzu Corporation

Sputtering Conditions:
Back pressure: 3.0×10$^{-6}$ Torr or lower
Ar gas pressure: 2.25×10$^{-3}$ Torr
Ar gas flow rate: 30 sccm
Sputtering power: DC 260 W
Distance: 52 mm
Substrate temperature: room temperature
Sputtering time: 120 seconds
Glass substrate: #1737 (50.8 mm in diameter, 0.7 mm in thickness) available from Corning Incorporated
Stylus profilometer Alpha-Step 250 available from Tencor Instruments Film-formation rate=average film thickness (nm)/ sputtering time (s)

The film-formation rate of each sputtering target was evaluated as excellent when it was 1.05 times or higher than the film-formation rate of the pure Al (purity, 4N) sputtering target produced as a sample.

(Measurement of Number of Splash Occurrence)

In this example, the number of splashes liable to occur under high sputtering power conditions was measured, and the occurrence of slashes was evaluated.

First, for the surface portion of sputtering target No. 1 shown in Table 1, a thin film was formed at a film-formation rate of 2.74 nm/s. Y value as a product of film-formation rate and sputtering power is as follows:

Y value=film-formation rate (2.74 nm/s)×sputtering power (260 W)=713

Then, for the sputtering targets shown in Table 1, sputtering power DC according to the film-formation rate shown in Table 1 was set, based on the Y value (constant) described above, and sputtering was carried out.

For example, the sputtering conditions for the surface portion of the sputtering target No. 2 were as follows:
Film-formation rate: 2.79 nm/s
Based on the following expression, sputtering power was set to 255 W.

Sputtering power=Y value (713)/film-formation rate (2.79)≈(approximately) 255 W

In this manner, the step pf sputtering described above was carried out continuously, while replacing a glass substrate, and 16 thin films were formed for each sputtering target. Therefore, sputtering was carried out for 120 (seconds)×16 (films)=1920 seconds.

Then, using a particle counter (Wafer Surface Analyzer WM-3 available from Topcon Corporation), particles observed on the surface of each thin film described above were measured for position coordinate, size (average particle diameter), and number of pieces. Pieces of 3 μm or greater in size were regarded herein as the particles. After that, this thin film surface was observed by an optical microscope (1000-fold magnification). Hemispherically-shaped pieces were regarded as splashes, and the number of splashes per unit area was counted.

The number of splashes described above was counted in the same manner at three positions, i.e., surface portion, (¼)×t portion, and (½)×t portion, of each sputtering target, for each of 16 thin films described above, and the average value of the number of splashes at three positions measured was regarded as the "number of splash occurrence". In this example, each sputtering target was evaluated as follows: "A" when the number of splash occurrence was 7 pieces/cm$^2$ or less; "B" when the number of splash occurrence was from 8 to 11 pieces/cm$^2$; "C" when the number of splash occurrence was from 12 to 21 pieces/cm$^2$; or "D" when the number of splash occurrence was 22 pieces/cm$^2$ or more. In this example, each sputtering target was evaluated as having the effect of inhibiting splash occurrence (passing) when the number of splash occurrence was 21 pieces/cm$^2$ or smaller (evaluation: "A", "B", or "C").

(Measurement of Electric Resistivity)

Samples of thin films for electric resistivity measurement were produced by the following procedures. On the surface of each thin film described above, a positive-type photoresist (novolac-type resin: TSMR-8900 available from Tokyo Ohka Kogyo Co., Ltd., 1.0 μm in thickness and 100 μm in line width) was formed into a stripe pattern by photolithography. Each sample was processed by wet etching into a pattern shape for electric resistivity measurement of 100 μm in line width and 10 mm in line length. A mixed solution of $H_3PO_4$ $HNO_3$:$H_2O$=75:5:20 was used for wet etching. To provide thermal history, atmospheric heat treatment keeping each sample at 250° C. for 30 minutes under a reduced nitrogen atmosphere (pressure: 1 Pa) in a CVD chamber was carried out after the etching treatment described above. After that, electric resistivity was measured at room temperature by a four probe method. Each sample was evaluated as excellent ("A") when it had an electric resistivity of 3.7 μΩcm or less, or as bad ("B") when it had an electric resistivity of higher than 3.7 μΩcm.

These test results are shown in Table 2.

TABLE 1

| | Target Composition by mass % (the remainder is Al and unavoidable impurities) | | | | | | Hot rolling start temperature (° C.) | Total reduction of hot rolling (%) | Maximum rolling reduction for each pass of hot rolling (%) | Cold rolling reduction (%) | Anneal conditions after hot rolling | Rolled plate thickness (mm) |
|---|---|---|---|---|---|---|---|---|---|---|---|---|
| No. | Fe | Si | Mn | Cr | Mo | Nb | Ti | | | | | | |
| 1 | 0.0005 | 0.0005 | | | | | | 280 | 40 | 25 | 25 | 150° C. × 2 hr | 20 |
| 2 | 0.002 | 0.002 | | | | | | 500 | 45 | 21 | — | 200° C. × 4 hr | 25 |
| 3 | 0.08 | 0.04 | | | | | | 480 | 55 | 35 | 20 | 150° C. × 4 hr | 18 |
| 4 | 0.3 | 0.05 | | | | | | 320 | 60 | 31 | 30 | 220° C. × 5 hr | 24 |
| 5 | 0.3 | 0.05 | 0.002 | | | | | 350 | 70 | 18 | — | 180° C. × 2 hr | 17 |
| 6 | 0.3 | 0.05 | | 0.001 | | 0.001 | | 400 | 85 | 12 | — | — | 30 |
| 7 | 0.3 | 0.05 | | | 0.001 | | 0.01 | 450 | 80 | 15 | 10 | — | 22 |
| 8 | 0.0005 | 0.0005 | | | | | | 450 | 38 | 38 | 20 | 200° C. × 4 hr | 25 |
| 9 | 0.35 | 0.0005 | 0.002 | | | | | 400 | 65 | 65 | 40 | 100° C. × 2 hr | 19 |
| 10 | 0.3 | 1.2 | | | | | | 550 | 35 | 46 | 30 | 350° C. × 4 hr | 26 |

TABLE 1-continued

| | Target Composition by mass % (the remainder is Al and unavoidable impurities) | | | | | | Production process | | | | |
|---|---|---|---|---|---|---|---|---|---|---|---|---|
| | | | | | | | | Hot rolling start temperature | Total reduction of hot rolling | Maximum rolling reduction for each pass of hot rolling | Cold rolling reduction | Anneal conditions after hot | Rolled plate thickness |
| No. | Fe | Si | Mn | Cr | Mo | Nb | Ti | (° C.) | (%) | (%) | (%) | rolling | (mm) |
| 11 | 1.1 | 0.05 | | | | | | 480 | 30 | 40 | 25 | 220° C. × 3 hr | 20 |
| 12 | 0.3 | 0.05 | 0.7 | | | | | 500 | 55 | 55 | 35 | 150° C. × 2 hr | 18 |

TABLE 2

| | Texture Crystal textures | | | | Thin film Characteristics | | | |
|---|---|---|---|---|---|---|---|---|
| No. | (1) Area ratio PA in surface portion (%) | (2) Area ratio PB in surface portion (%) | (3) Ratio of area ratio PA to area ratio QA | (4) Ratio of area ratio PB to area ratio QB | Film-formation rate ratio in surface portion (within 1 mm) | Film-formation rate ratio in (1/4) × t portion | Interconnection resistance μΩcm | Splashes |
| 1 | 32 | 28 | 0.85 | 1.16 | 1.07 | 1.05 | 2.8 | B |
| 2 | 16 | 33 | 0.82 | 1.18 | 1.09 | 1.07 | 3.1 | B |
| 3 | 48 | 22 | 0.68 | 1.31 | 1.05 | 1.07 | 3.2 | B |
| 4 | 17 | 18 | 0.71 | 1.42 | 1.06 | 1.08 | 3.2 | B |
| 5 | 26 | 56 | 0.51 | 2.72 | 1.11 | 1.09 | 3.2 | A |
| 6 | 6 | 71 | 0.33 | 7.19 | 1.18 | 1.13 | 3.2 | A |
| 7 | 8 | 63 | 0.46 | 4.85 | 1.15 | 1.1 | 3.3 | A |
| 8 | 57 | 13 | 0.86 | 1.09 | 1.00 | 0.99 | 3.1 | C |
| 9 | 61 | 10 | 0.92 | 0.96 | 0.97 | 0.95 | 3.8 | B |
| 10 | 52 | 15 | 0.84 | 1.12 | 1.01 | 0.98 | 5.3 | D |
| 11 | 46 | 17 | 0.83 | 1.14 | 0.99 | 0.99 | 4.1 | D |
| 12 | 59 | 11 | 0.87 | 1.05 | 0.98 | 0.96 | 3.9 | B |

From Tables 1 and 2, discussion can be made as follows.

First, Nos. 1 to 7 are examples with alloy compositions and crystal orientation distributions fulfilling the requirements of the present invention, and therefore, the effect of inhibiting the occurrence of splashes was observed, even if film-formation rate was made higher.

Nos. 1 and 2 are examples in which the ratio of the surface portion to the inner portion (the requirements (3) and (4) in Table 2) could not be optimized, but the area ratios in the surface portion (the requirements (1) and (2) in Table 2) could appropriately be controlled, and therefore, <011> as a factor causing a decrease of sputtering rate in the inner portion of a sputtering target was low, but <001> and <111> were high. For this reason, these examples exhibited high film-formation rate in the surface portion of the sputtering target and ensured sufficient film-formation rate, while film-formation rate became low (examples fulfilling only (1) PA and (2) PB).

Nos. 3 and 4 are examples in which one of the crystal texture area ratios in the surface portion (the requirements (1) and (2) in Table 2) could not appropriately be controlled, and therefore, film-formation rate in the surface portion became lower than those of examples (Nos. 1, 2 and 5 to 7) with textures fulfilling both the requirements (1) and (2), but sufficient film-formation rate could be ensured (examples fulfilling (1) PA or (2) PB and further fulfilling (3) PA/QA and (4) PB/QB).

Nos. 5 to 7 are examples with textures fulfilling all the requirements of the present invention (the requirements (1) to (4) in Table 2), and these examples were excellent in all the characteristics such as film-formation rate, interconnection resistance, and splashes (examples fulfilling all of (1) PA, (2) PB, (3) PA/QA, and (4) PB/QB).

Nos. 8 to 12 are examples fulfilling none of (1) PA, (2) PB, (3) PA/QA, and (4) PB/QB, of which characteristics were inferior, such as film-formation rate, interconnection resistance, and splashes.

No. 8 is an example having high maximum rolling reduction for each pass and low total rolling reduction in the hot rolling. In this example, the ratio in the surface portion and the ratio of the surface portion to the inner portion were outside the respective ranges defined in the present invention, and therefore, desired film-formation rate ratio was not obtained.

No. 9 is an example having high maximum rolling reduction for each pass in the hot rolling and high cold rolling reduction. In this example, the ratio in the surface portion and the ratio of the surface portion to the inner portion were outside the respective ranges defined in the present invention, and therefore, neither desired film-formation rate ratio nor interconnection resistance was obtained.

No. 10 was an example having high Si content, high maximum rolling reduction for each pass and low total rolling reduction in the hot rolling. In this example, desired crystal texture was not obtained, film-formation rate and interconnection resistance were inferior, and the occurrence of splashes was observed.

No. 11 is an example having high Fe content, high maximum rolling reduction in each pass and low total rolling reduction in the hot rolling. In this example, the ratio in the surface portion and the ratio of the surface portion to the inner portion were outside the respective ranges defined in the present invention, and therefore, desired film-formation rate ratio and interconnection resistance were inferior, and the occurrence of splashes was observed.

No. 12 is an example having high Mn content, and high maximum rolling reduction in each pass in the hot rolling and high cold rolling reduction. In this example, the ratio in the surface portion and the ratio of the surface portion to the inner portion were outside the respective ranges defined in the present invention, and therefore, neither desired film-formation rate ratio nor interconnection resistance was obtained.

The invention claimed is:

1. A sputtering target, comprising an Al-based alloy or a Cu-based alloy, wherein the Al-based alloy or Cu-based alloy sputtering target satisfies a requirement (1), a requirement (2), or both requirements (1) and (2), when crystal orientations <001>, <011>, <111>, <112>, and <012> in a sputtering surface normal direction, in a depth within 1 mm from an uppermost surface, of the sputtering target are observed by an electron backscatter diffraction pattern method, and a total area ratio <001>±15°, <011>±15°, <111>±15°, <112>±15°, and <012>±15° is referred to as a P value:
    (1) an area ratio PA of <011>±15° to the P value is 40% or lower;
    (2) a total area ratio PB of <001>±15° and <111>±15° to the P value 20% or higher.

2. The sputtering target according to claim 1, wherein the Al-based alloy or Cu-based alloy sputtering target satisfies a requirement (3), a requirement (4), or both requirements (3) and (4), when crystal orientations <001>, <011>, <111>, <112>, and <012> in the sputtering surface normal direction, in a depth of a (¼)×t (thickness) portion from the uppermost surface, of the sputtering target are observed by the electron backscatter diffraction pattern method, and a total area ratio of <001>±15°, <011>±15°, <111>±15°, <112>±15°, and <012>±15° is referred to as a Q value:
    (3) a ratio of the area ratio PA of <011>±15° in the depth within 1 mm from the uppermost surface to an area ratio QA of <011>±15° in the depth of the (¼)×t portion to the Q value satisfies: 0.8 ≥PA/QA;
    (4) a ratio of the total area ratio PB of <001>±15° and <111>±15° in the depth within 1 mm from the uppermost surface to a total area ratio QB of <001>±15° and <111>±15° in the depth of the (¼)×t portion to the Q value satisfies: 1.2 <PB/QB.

3. The sputtering target according to claim 1, wherein the sputtering target comprises an Al-based alloy comprising:
    0.0001 to 1.0 mass % of Fe; and
    0.0001 to 1.0 mass % of Si.

4. The sputtering target according to claim 3, wherein the Al-based alloy further comprises:
    0.0001 to 0.5 mass % of at least one selected from the group consisting of Mn, Cr, Mo, Nb, Ti, and Ta.

5. The sputtering target according to claim 1, wherein the sputtering target comprises a Cu-based alloy comprising:
    0.00001 to 0.04 mass % of oxygen;
    0.00001 to 0.003 mass % of hydrogen; and
    0.01 mass % or lower of unavoidable impurities.

6. The sputtering target according to claim 2, wherein the sputtering target comprises an Al-based alloy comprising:
    0.0001 to 1.0 mass % of Fe; and
    0.0001 to 1.0 mass % of Si.

7. The sputtering target according to claim 6, wherein the Al-based alloy further comprises:
    0.0001 to 0.5 mass % of at least one selected from the group consisting of Mn, Cr, Mo, Nb, Ti, and Ta.

8. The sputtering target according to claim 2, wherein the sputtering target comprises a Cu-based alloy comprising:
    0.00001 to 0.04 mass % of oxygen;
    0.00001 to 0.003 mass % of hydrogen; and
    0.01 mass % or lower of unavoidable impurities.

* * * * *